United States Patent
Nakagawa

(10) Patent No.: US 9,847,770 B2
(45) Date of Patent: Dec. 19, 2017

(54) ELASTIC WAVE RESONATOR, ELASTIC WAVE FILTER APPARATUS, AND DUPLEXER

(71) Applicant: Murata Manufacturing Co., Ltd., Nagaokakyo-shi, Kyoto-fu (JP)

(72) Inventor: Ryo Nakagawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/014,172

(22) Filed: Feb. 3, 2016

(65) Prior Publication Data

US 2016/0156334 A1    Jun. 2, 2016

Related U.S. Application Data

(63) Continuation of application No. PCT/JP2014/072947, filed on Sep. 1, 2014.

(30) Foreign Application Priority Data

Sep. 6, 2013 (JP) ................. 2013-185420

(51) Int. Cl.
 *H03H 9/72* (2006.01)
 *H03H 9/25* (2006.01)
 (Continued)

(52) U.S. Cl.
 CPC ........ *H03H 9/725* (2013.01); *H03H 9/02992* (2013.01); *H03H 9/14591* (2013.01);
 (Continued)

(58) Field of Classification Search
 CPC .......... H03H 9/02543; H03H 9/02637; H03H 9/02992; H03H 9/14591; H03H 9/25;
 (Continued)

(56) References Cited

U.S. PATENT DOCUMENTS 4,331,943 A * 5/1982 Cross ................. H03H 9/02818
 331/107 A
5,912,602 A * 6/1999 Takagi ............... H03H 9/02834
 310/313 D
(Continued)

FOREIGN PATENT DOCUMENTS

JP    59-021115 A  *  2/1984  .......... H03H 9/1455
JP    62-256515 A  * 11/1987
(Continued)

OTHER PUBLICATIONS

Partial English language machine translation of the claims of JP 01-151621 U, published Oct. 19, 1989, 1 page.*
(Continued)

*Primary Examiner* — Barbara Summons
(74) *Attorney, Agent, or Firm* — Keating & Bennett, LLP

(57) ABSTRACT

In an elastic wave resonator, a first IDT electrode, a second IDT electrode, a first reflector, and a second reflector are located on a piezoelectric substrate. The first IDT electrode and the second IDT electrode share a shared bus bar. Between a first terminal and a second terminal, the first IDT electrode and the second IDT electrode are connected in parallel. The shared bus bar and the first reflector are connected to the first terminal. A first bus bar and a second bus bar are connected to the second reflector, and are further connected to the second terminal.

19 Claims, 9 Drawing Sheets

(51) Int. Cl.
  *H03H 9/64* (2006.01)
  *H03H 9/02* (2006.01)
  *H03H 9/145* (2006.01)
  *H03H 9/76* (2006.01)

(52) U.S. Cl.
  CPC ............ *H03H 9/25* (2013.01); *H03H 9/6469* (2013.01); *H03H 9/6476* (2013.01); *H03H 9/6483* (2013.01); *H03H 9/64* (2013.01); *H03H 9/76* (2013.01)

(58) Field of Classification Search
  CPC ...... H03H 9/64; H03H 9/6459; H03H 9/6469; H03H 9/6476; H03H 9/6483; H03H 9/725; H03H 9/76; H03H 9/1455
  USPC .............................. 333/133, 195; 310/313 D
  See application file for complete search history.

(56) References Cited

U.S. PATENT DOCUMENTS

| | | | | |
|---|---|---|---|---|
| 5,932,950 A | * | 8/1999 | Yamada | H03H 9/0028 310/313 B |
| 6,060,964 A | * | 5/2000 | Baier | H03H 9/6426 310/313 B |
| 6,163,236 A | * | 12/2000 | Thomas | H03H 9/02716 310/313 D |
| 6,441,704 B1 | * | 8/2002 | Ali-Hackl | H03H 9/0038 310/313 B |
| 6,891,450 B2 | * | 5/2005 | Nakamura | H03H 9/0038 310/313 D |

FOREIGN PATENT DOCUMENTS

| | | |
|---|---|---|
| JP | 1-151621 U | 10/1989 |
| JP | 33-119816 A | 5/1991 |
| JP | 04-373304 A * | 12/1992 |
| JP | 2000-049566 A | 2/2000 |
| JP | 2001-230659 A | 8/2001 |
| JP | 2004-320411 A | 11/2004 |
| JP | 2007-116628 A | 5/2007 |
| JP | 2007-158715 A | 6/2007 |

OTHER PUBLICATIONS

Official Communication issued in International Patent Application No. PCT/JP2014/072947, dated Oct. 28, 2014.

Inoue, S. et al., "A Triple-Beat-Free PCS SAW Duplexer", IEEE Ultrason. Symp., 4 pages, 2012.

* cited by examiner

COMPARATIVE EXAMPLE

ELASTIC WAVE RESONATOR, ELASTIC WAVE FILTER APPARATUS, AND DUPLEXER

BACKGROUND OF THE INVENTION

1. Field of the Invention

The present invention relates to a one-port elastic wave resonator in which IDT electrodes are provided on a piezoelectric substrate. The present invention further relates to an elastic wave filter apparatus and a duplexer each including the one-port elastic wave resonator.

2. Description of the Related Art

As a resonator in a filter apparatus, a surface acoustic wave resonator has been widely used. "A Triple-Beat-Free PCS SAW Duplexer," (IEEE Ultrason. Symp., pp. 67-70, 2012) discloses a one-port surface acoustic wave resonator including a serially divided type IDT electrode. In this one-port surface acoustic wave resonator, a first IDT electrode and a second IDT electrode are connected in series. In order to obtain the same impedance as that obtained in a case where a serially divided type IDT electrode is not used, the areas of the first and second IDT electrodes are large. This leads to reduction in energy density in the first and second IDT electrodes and the suppression of distortions generated by a nonlinear signal.

On the other hand, Japanese Unexamined Patent Application Publication No. 2004-320411 discloses a surface acoustic wave apparatus used to increase a thermal shock resistance. In this surface acoustic wave apparatus, two surface acoustic wave resonator portions are formed on a piezoelectric substrate. These two surface acoustic wave resonator portions are connected in parallel. That is, a first IDT electrode forming a first surface acoustic wave resonator portion and a second IDT electrode forming a second surface acoustic wave resonator portion are electrically connected in parallel.

With the surface acoustic wave apparatus disclosed in "A Triple-Beat-Free PCS SAW Duplexer," (IEEE Ultrason. Symp., pp. 67-70, 2012), it is possible to reduce nonlinear distortions. However, since the areas of the first and second IDT electrodes are large, it is difficult to achieve size reduction.

On the other hand, in the surface acoustic wave apparatus disclosed in Japanese Unexamined Patent Application Publication No. 2004-320411, in order to increase a thermal shock resistance, a parallel connection structure is employed. With this structure, it is possible to suppress nonlinear distortions without increasing the areas of IDT electrodes. However, in the parallel connection structure disclosed in Japanese Unexamined Patent Application Publication No. 2004-320411, a routing line for connecting the first and second IDT electrodes takes up a lot of space. It is therefore difficult to achieve miniaturization.

SUMMARY OF THE INVENTION

Preferred embodiments of the present invention provide a one-port elastic wave resonator that significantly reduces or prevents nonlinear distortions and achieves miniaturization.

Preferred embodiments of the present invention also provide an elastic wave filter apparatus and a duplexer each including an elastic wave resonator that significantly reduces or prevents nonlinear distortions and achieves miniaturization.

An elastic wave resonator according to a preferred embodiment of the present invention is a one-port elastic wave resonator including a first terminal and a second terminal. An elastic wave resonator according to a preferred embodiment of the present invention includes a piezoelectric substrate, a first IDT electrode and a second IDT electrode located on the piezoelectric substrate, and a first reflector and a second reflector, one of which is disposed on one side of a region where the first IDT electrode and the second IDT electrode are located, the other one of which is disposed on the other side of the region, and which are shared by the first IDT electrode and the second IDT electrode.

The first IDT electrode includes a first bus bar and a shared bus bar disposed apart from the first bus bar. The second IDT electrode shares the shared bus bar with the first IDT electrode and includes a second bus bar disposed apart from the shared bus bar.

The first bus bar is disposed across the shared bus bar from the second bus bar.

The shared bus bar is electrically connected to the first reflector and is connected to the first terminal. The second reflector is connected to the first bus bar and the second bus bar and is further connected to the second terminal.

The first IDT electrode and the second IDT electrode are electrically connected in parallel between the first terminal and the second terminal.

In an aspect of an elastic wave resonator according to a preferred embodiment of the present invention, a voltage application direction between the first bus bar and the shared bus bar in the first IDT electrode is the same as a projected polarization direction obtained by projecting a polarization direction of the piezoelectric substrate on a surface of the piezoelectric substrate, and a voltage application direction between the shared bus bar and the second bus bar in the second IDT electrode is opposite to the projected polarization direction.

In another aspect of an elastic wave resonator according to a preferred embodiment of the present invention, each of the first reflector and the second reflector includes a plurality of electrode fingers, a first end bus bar that couples first end portions of the electrode fingers, a second end bus bar that couples second end portions of the electrode fingers, and an intermediate bus bar that couples intermediate portions of the electrode fingers.

In still another aspect of an elastic wave resonator according to a preferred embodiment of the present invention, the first bus bar and the first end bus bar in the second reflector extend in the same direction and are integrated, and the second bus bar and the second end bus bar in the second reflector extend in the same direction and are integrated.

In still another aspect of an elastic wave resonator according to a preferred embodiment of the present invention, the shared bus bar and the intermediate bus bar in the first reflector extend in the same direction and are integrated.

An elastic wave filter apparatus according to a preferred embodiment of the present invention includes a plurality of elastic wave resonators, at least one of which is an elastic wave resonator according to one of the above-described preferred embodiments of the present invention.

In an aspect of an elastic wave filter apparatus according to a preferred embodiment of the present invention, the elastic wave resonators define a ladder circuit.

In another aspect of an elastic wave filter apparatus according to a preferred embodiment of the present invention, the ladder circuit includes a plurality of series arm resonators and a plurality of parallel arm resonators, the series arm resonators and the parallel arm resonators are the elastic wave resonators, and at least one of the series arm resonators and the parallel arm resonators is an elastic wave resonator according to one of the above-described preferred embodiments of the present invention.

A duplexer according to a preferred embodiment of the present invention includes a first band-pass filter connected to an antenna terminal and a second band-pass filter that is connected to the antenna terminal and has a pass band different from that of the first band-pass filter. At least one of the first band-pass filter and the second band-pass filter includes an elastic wave resonator according to one of the above-described preferred embodiments of the present invention.

In an aspect of the duplexer according to the present invention, at least one of the first band-pass filter and the second band-pass filter includes a plurality of elastic wave resonators, and at least one of the elastic wave resonators on the nearest side to the antenna terminal is an elastic wave resonator according to one of the above-described preferred embodiments of the present invention.

An elastic wave resonator according to a preferred embodiment of the present invention significantly reduces or prevents nonlinear distortions and achieves miniaturization.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

Figure 1A:
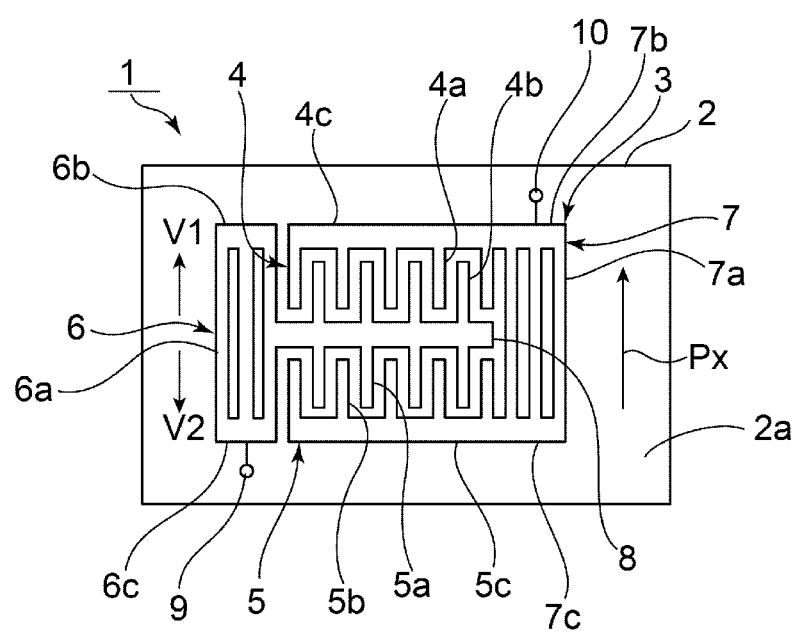
FIG. 1A is a plan view of an elastic wave resonator according to a first preferred embodiment of the present invention.
Figure 1B:
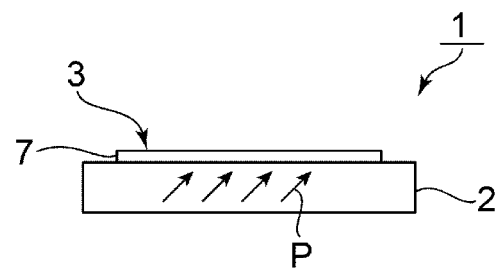
FIG. 1B is a side view of the elastic wave resonator.

FIG. 1A is a plan view of an elastic wave resonator according to a first preferred embodiment of the present invention, and FIG. 1B is a side view of the elastic wave resonator.

An elastic wave resonator 1 is a one-port elastic wave resonator. In this preferred embodiment, the elastic wave resonator 1 preferably is a surface acoustic wave resonator that uses a surface acoustic wave.

The elastic wave resonator 1 includes a piezoelectric substrate 2. In this preferred embodiment, the piezoelectric substrate 2 preferably is made of $LiTaO_3$, but may be made of another piezoelectric single crystal such as $LiNbO_3$ or piezoelectric ceramics.

The polarization direction of the piezoelectric substrate 2 is a P direction represented by arrows in FIG. 1B. A projected polarization direction Px in FIG. 1A is a direction obtained by projecting the polarization direction P illustrated in FIG. 1B on the main surface of the piezoelectric substrate 2.

On an upper surface 2a of the piezoelectric substrate 2, an electrode structure 3 is provided. In the electrode structure 3 according to this preferred embodiment, Ti and an Al—Cu alloy preferably are laminated. However, a metal material for the electrode structure is not limited to Ti/Al—Cu, and Pt, Cu, Au, Al, Ti, Ag, Pd, W, Mo, and alloys thereof may be used. The electrode structure 3 may include a stacked metal film.

The electrode structure 3 includes a first IDT electrode 4, a second IDT electrode 5, a first reflector 6, and a second reflector 7.

The first IDT electrode 4 includes a plurality of first electrode fingers 4a and a plurality of second electrode fingers 4b. The first electrode fingers 4a and the second electrode finger 4b are interdigitated with each other.

The first electrode fingers 4a and the second electrode fingers 4b extend in a direction parallel or substantially parallel to the projected polarization direction Px.

One end of each of the first electrode fingers 4a is connected to a first bus bar 4c. One end of each of the second electrode fingers 4b is electrically connected to a shared bus bar 8.

The second IDT electrode 5 includes a plurality of third electrode fingers 5a and a plurality of fourth electrode fingers 5b. The third electrode fingers 5a and the fourth electrode fingers 5b are interdigitated with each other. The third electrode fingers 5a and the fourth electrode fingers 5b extend in a direction parallel or substantially parallel to the projected polarization direction Px.

One end of each of the third electrode fingers 5a is connected to the shared bus bar 8, and the other end extends toward a second bus bar 5c.

One end of each of the fourth electrode fingers 5b is connected to the second bus bar 5c, and the other end extends toward the shared bus bar 8.

In this preferred embodiment, the first bus bar 4c, the second bus bar 5c, and the shared bus bar 8 extend in a direction perpendicular or substantially perpendicular to the projected polarization direction Px. The first bus bar 4c and the second bus bar 5c extend in a direction parallel or substantially parallel to the shared bus bar 8.

In the electrode structure 3, the first IDT electrode 4 and the second IDT electrode 5 are arranged on a back-to-back basis with the shared bus bar 8 interposed therebetween. That is, the first IDT electrode 4 is located on one side of the shared bus bar 8, and the second IDT electrode 5 is located on the other side of the shared bus bar 8.

The first IDT electrode 4 and the second IDT electrode 5 share the shared bus bar 8 and are arranged on a back-to-back basis. Accordingly, a portion where the first IDT electrode 4 and the second IDT electrode 5 are located is able to be significantly reduced in size.

On the other hand, the first reflector 6 is disposed on one side of a region where the first IDT electrode 4 and the second IDT electrode 5 extend in a surface acoustic wave propagation direction, and the second reflector 7 is disposed on the other side of the region in the surface acoustic wave propagation direction. The first reflector 6 and the second reflector 7 are shared by a first resonance portion defined of the first IDT electrode 4 and a second resonance portion defined of the second IDT electrode 5. That is, the first reflector 6 and the second reflector 7 are disposed to reflect a surface acoustic wave excited by the first IDT electrode 4 and a surface acoustic wave excited by the second IDT electrode 5.

More specifically, the first reflector 6 includes a plurality of electrode fingers 6*a*, a first end bus bar 6*b*, and a second end bus bar 6*c*. First ends of the electrode fingers 6*a* are coupled by the first end bus bar 6*b*. Second ends of the electrode fingers 6*a* are coupled by the second end bus bar 6*c*. The electrode fingers 6*a* extend a lateral direction with respect to the first IDT electrode 4 and the second IDT electrode 5. More specifically, the electrode fingers 6*a* extend in a lateral direction with respect to the intersection of the electrode fingers of the first IDT electrode 4 and the intersection of the electrode fingers of the second IDT electrode 5 to reflect a surface acoustic wave propagated as described previously.

Like the first reflector 6, the second reflector 7 includes a plurality of electrode fingers 7*a*, a first end bus bar 7*b*, and a second end bus bar 7*c*. The second reflector 7 is also disposed to reflect a surface acoustic wave excited by the first IDT electrode 4 and a surface acoustic wave excited by the second IDT electrode 5.

The elastic wave resonator 1 according to this preferred embodiment is a one-port elastic wave resonator including a first terminal 9 and a second terminal 10. The shared bus bar 8 and the first reflector 6 are electrically connected to each other. That is, in this preferred embodiment, the shared bus bar 8 extends toward the first reflector 6, and is coupled with the intermediate portion of the electrode finger 6*a*. The first terminal 9 is electrically connected to the shared bus bar 8 and the first reflector 6.

On the other hand, in this preferred embodiment, the first bus bar 4*c* is integrated with the first end bus bar 7*b* in the second reflector 7. The second bus bar 5*c* is similarly integrated with the second end bus bar 7*c*. In this preferred embodiment, the first bus bar 4*c* and the first end bus bar 7*b* have the same width, extend in the same direction, and are integrated. The second bus bar 5*c* and the second end bus bar 7*c* also have the same width, extend in the same direction, and are integrated. The second terminal 10 is connected to the second reflector 7, the first bus bar 4*c* and the second bus bar 5*c*.

Accordingly, between the first terminal 9 and the second terminal 10, the first IDT electrode 4 and the second IDT electrode 5 are electrically connected in parallel. As illustrated in the drawing, a voltage application direction V1 in a region between the first bus bar 4*c* and the shared bus bar 8 in the first IDT electrode 4 is opposite to a voltage application direction V2 in a region between the shared bus bar 8 and the second bus bar 5*c* in the second IDT electrode 5. More specifically, the voltage application direction V1 is the same as the projected polarization direction Px, and the voltage application direction V2 is opposite to the projected polarization direction Px.

In the elastic wave resonator 1 according to this preferred embodiment having the above-described structure achieves suppression of nonlinear distortions and size reduction. This point will be described in detail with reference to FIG. 8.

Figure 8:
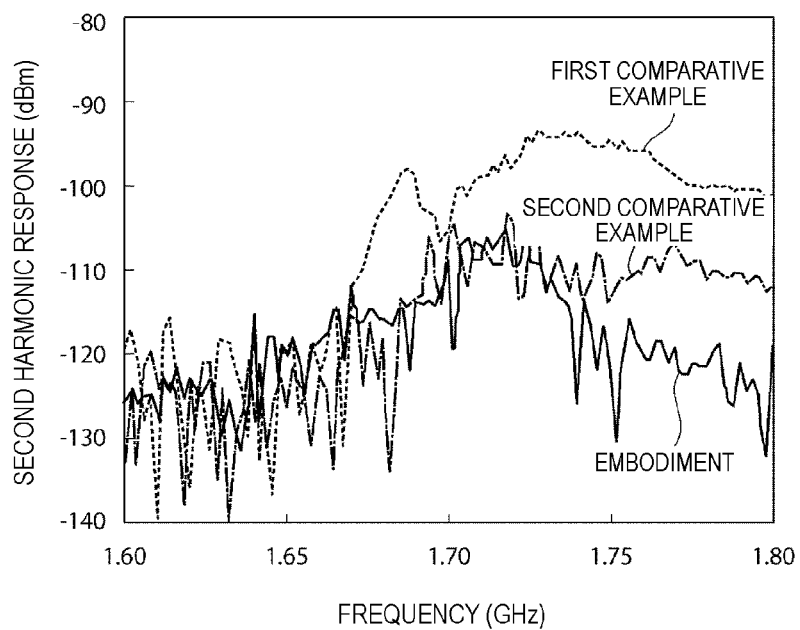
FIG. 8 is a diagram illustrating attenuation frequency characteristics representing second harmonic responses of an elastic wave resonator according to a preferred embodiment of the present invention, an elastic wave resonator that is a first comparative example, and an elastic wave resonator that is a second comparative example.

A solid line in FIG. 8 indicates attenuation frequency characteristics representing the response of a second harmonic that is the source of nonlinear distortions in a case where the elastic wave resonator 1 is manufactured in accordance with the following specifications.

Example specifications for the elastic wave resonator 1 are as follows. The IDT electrodes 4 and 5: an electrode material is a laminated structure that is formed of a Ti/Al— Cu film and has a thickness of 30 nm/380 nm. The number of pairs of electrode fingers=80 pairs. An electrode finger intersecting width=50 µm. The width of the shared bus bar 8=15 µm. The width of the first bus bar 4*c* and the second bus bar 5*c*=15 µm. The number of the electrode fingers 6*a* of the first reflector 6 and the number of the electrode fingers 7*a* of the second reflector 7=15. The width of the first end bus bar 6*b*, the second end bus bar 6*c*, the first end bus bar 7*b*, and the second end bus bar 7*c*=15 µm.

For comparison, the following first and second comparative examples are prepared. As the first comparative example, a usual one-port elastic wave resonator is prepared by disposing reflectors on both sides of a single IDT electrode, and is the same as the above-described one-port elastic wave resonator according to a preferred embodiment of the present invention except that an electrode finger intersecting width of the IDT electrode is about 100 µm, for example, the IDT electrode does not have a parallel division structure, and the reflectors on both sides of the IDT electrode are not electrically connected to the IDT electrode.

Figure 10:
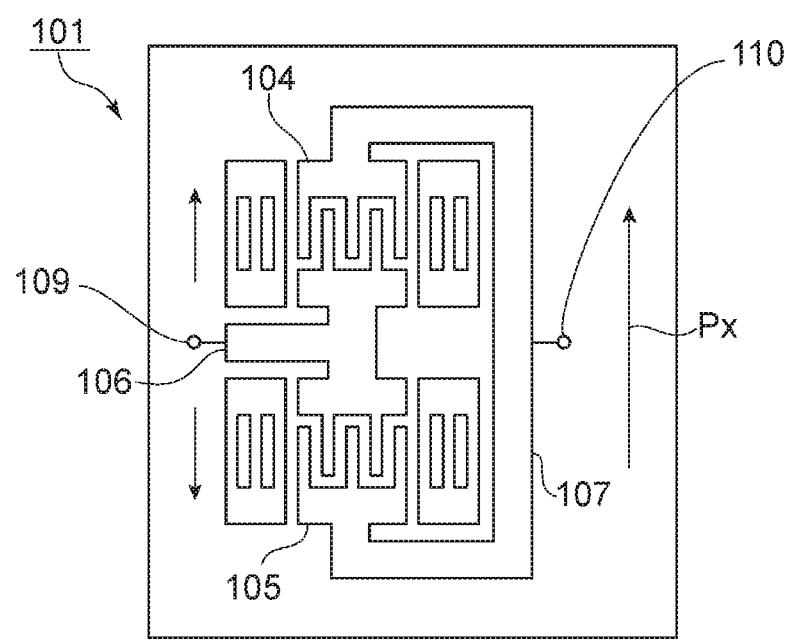
FIG. 10 is a plan view of an elastic wave resonator that is the second comparative example.

As the second comparative example, an elastic wave resonator 101 having an electrode structure illustrated in FIG. 10 is manufactured. Like in the elastic wave resonator 1, in the elastic wave resonator 101 illustrated in FIG. 10, a first IDT electrode 104 and a second IDT electrode 105 are connected in parallel between a first terminal 109 and a second terminal 110. One of bus bars of the first IDT electrode 104 and one of bus bars of the second IDT electrode 105 are connected to each other by a routing line 106, and are connected to the first terminal 109. The other one of the bus bars of the first IDT electrode 104 and the other one of the bus bars of the second IDT electrode 105 are connected to each other by a routing line 107 surrounding a region where the IDT electrodes 104 and 105 are disposed. The routing line 107 is connected to the second terminal 110. The other structure of this elastic wave resonator is the same as the above-described structure according to a preferred embodiment of the present invention.

Referring to FIG. 8, a broken line indicates a result of the first comparative example and a dot-and-dash line indicates a result of the second comparative example.

As is apparent from FIG. 8, using the parallel and reverse connection structure of the second comparative example and a preferred embodiment of the present invention, it is possible to more efficiently reduce or prevent the response of a second harmonic as compared with the first comparative example. In particular, according to a preferred embodiment of the present invention, it is possible to more efficiently reduce or prevent the response of a second harmonic, that is, second-order nonlinear distortions, as compared with the second comparative example. The reason for the improvement of nonlinear distortions is that the sharing of a bus bar leads to the coupling of waves between two IDTs and the improvement of a structural symmetry.

On the other hand, as is apparent from the comparison between FIG. 10 and FIG. 1A, routing lines are provided in the second comparative example and take up a lot of space.

Furthermore, the bus bars and reflectors of the first IDT electrode 104 and the second IDT electrode 105 are separately provided. Thus, an area for the formation of an electrode structure on a piezoelectric substrate is very large. In contrast, in the elastic wave resonator 1 according to a preferred embodiment of the present invention, the electrode structure 3 is significantly reduced in size. That is, it is possible to achieve the efficient suppression of nonlinear distortions and a large reduction in the size of the elastic wave resonator.

Figure 2:
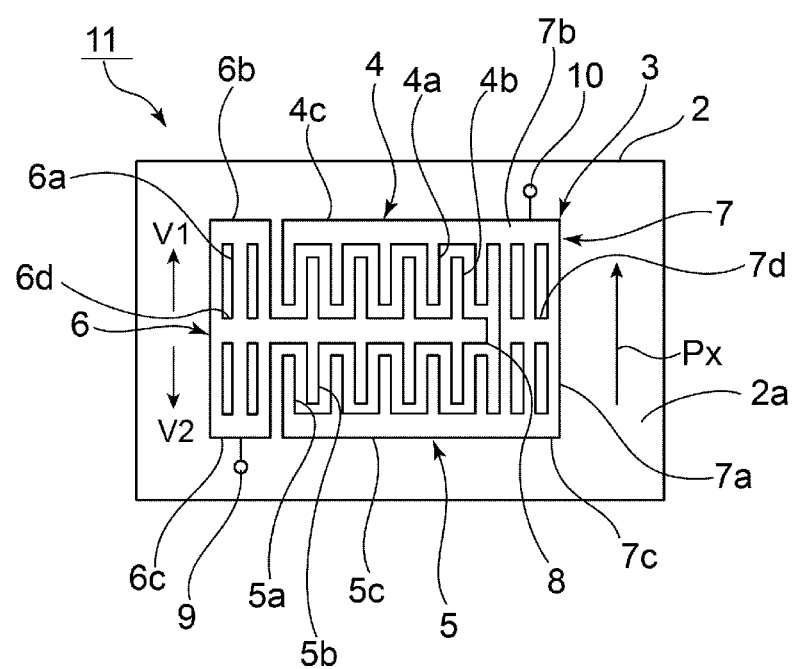
FIG. 2 is a plan view of an elastic wave resonator according to a second preferred embodiment of the present invention.

FIG. 2 is a plan view of an elastic wave resonator according to a second preferred embodiment of the present invention. In an elastic wave resonator according to the second preferred embodiment, the first reflector 6 and the second reflector 7 include intermediate bus bars 6d and 7d, respectively. The elastic wave resonator according to the second preferred embodiment is preferably the same as the elastic wave resonator according to the first preferred embodiment except for this point. In the drawing, the same reference numeral is used to represent the same component or the same part so as to avoid repeated explanation. In this preferred embodiment, the intermediate bus bar 6d is provided to couple the intermediate portions of the electrode fingers 6a, and the intermediate bus bar 7d is provided to couple the intermediate portions of the electrode fingers 7a. The number of current paths to the first terminal 9 and the second terminal 10 via the first reflector 6 and the second reflector 7 is therefore provided. According to the second preferred embodiment, it is possible to reduce the loss of a transmission signal caused by the resistances of the electrode fingers as compared with the first preferred embodiment.

In the first and second preferred embodiments, the first bus bar 4c has the same width as the first end bus bar 7b and they extend in the same direction, and the second bus bar 5c has the same width as the second end bus bar 7c and they extend in the same direction. However, in various preferred embodiments of the present invention, the first bus bar 4c and the second bus bar 5c do not necessarily have to have the same width as the first end bus bar 7b and the second end bus bar 7c, respectively.

The first bus bar 4c and the second bus bar 5c may extend in directions different from directions in which the first end bus bar 7b and the second end bus bar 7c extend, respectively.

However, it is desired that they have the same width and extend in the same direction. This leads to a further reduction in size.

The shared bus bar 8 extends parallel or substantially parallel to the first bus bar 4c and the second bus bar 5c, but does not necessarily have to extend parallel or substantially parallel to them.

Furthermore, it is desired that a region where the first reflector 6, the second reflector 7, and the IDT electrodes 4 and 5 are disposed, that is, a region where the electrode structure 3 is located, be rectangular or substantially rectangular as illustrated in FIG. 1A. This leads to a further reduction in size.

Next, duplexers according to third to seventh preferred embodiments of the present invention will be described.

Figure 3:
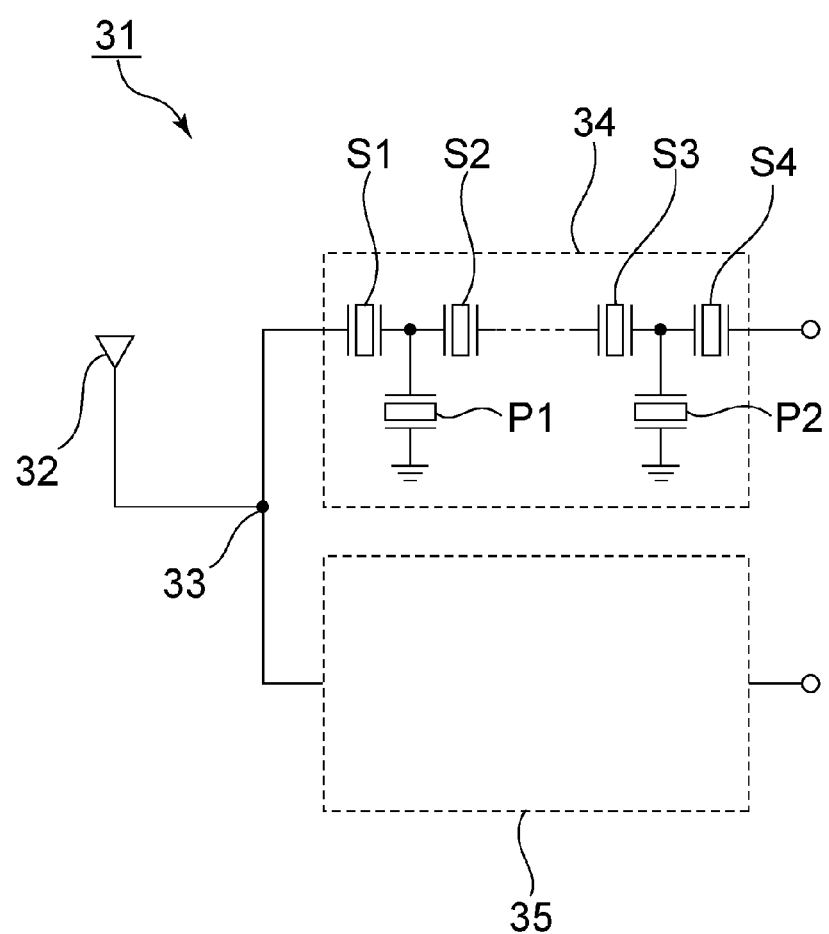
FIG. 3 is a circuit diagram of a duplexer according to a third preferred embodiment of the present invention.

FIG. 3 is a circuit diagram of a duplexer according to the third preferred embodiment of the present invention. In a duplexer 31, an antenna terminal 33 is connected to an antenna 32. One end of a first band-pass filter 34 and one end of a second band-pass filter 35 are connected to the antenna terminal 33. In this preferred embodiment, the first band-pass filter 34 is a transmitter filter and the second band-pass filter 35 is a receiver filter in a cellular phone. That is, the pass band of the second band-pass filter 35 differs from that of the first band-pass filter 34.

In the third preferred embodiment, the first band-pass filter 34 includes a plurality of series arm resonators S1 to S4 and a plurality of parallel arm resonators P1 and P2. That is, a ladder circuit is provided.

The series arm resonators S1 to S4 and the parallel arm resonators P1 and P2 are elastic wave resonators. In this preferred embodiment, the series arm resonator S1 and the parallel arm resonator P1 which are nearest to the antenna terminal 33 among these elastic wave resonators include the elastic wave resonators 1. Accordingly, it is possible to efficiently reduce or prevent nonlinear distortions and miniaturize the first band-pass filter 34 that is an elastic wave filter apparatus and the duplexer 31.

In the first band-pass filter 34 in the duplexer 31, the series arm resonator S1 and the parallel arm resonator P1 include the elastic wave resonators 1. However, only the series arm resonator S1 may be defined by the elastic wave resonator 1. Alternatively, all of the series arm resonators S1 to S4 and the parallel arm resonators P1 and P2 may be defined by the elastic wave resonators 1. That is, all that is required is that at least one of the elastic wave resonators is an elastic wave resonator according to a preferred embodiment of the present invention.

It is desired that the reduction or prevention of nonlinear distortions be performed by an elastic wave resonator nearest to a synthesis end in the first band-pass filter 34 in the duplexer 31. Accordingly, as described previously, it is desired that the series arm resonator S1 and the parallel arm resonator P1 be defined by the elastic wave resonators 1 according to a preferred embodiment of the present invention. In this case, only the series arm resonator S1 nearest to the antenna terminal 33 may be defined by the elastic wave resonator 1.

Figure 4:
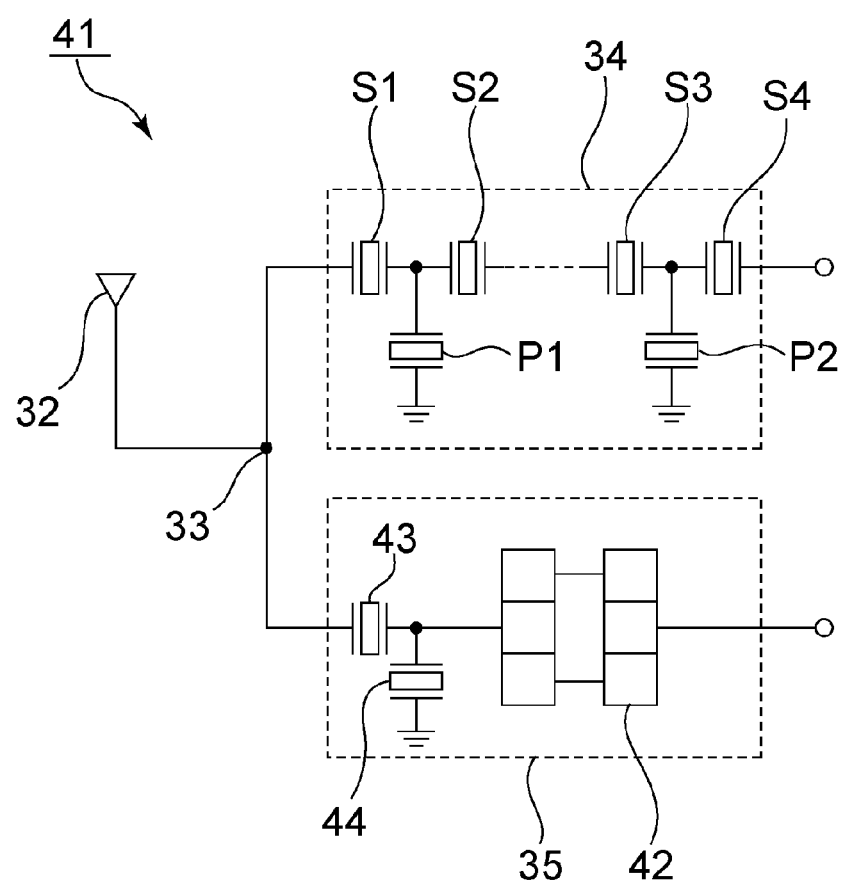
FIG. 4 is a circuit diagram of a duplexer according to a fourth preferred embodiment of the present invention.

In a duplexer 41 according to the fourth preferred embodiment of the present invention illustrated in FIG. 4, the first band-pass filter 34 is preferably the same as the first band-pass filter in the duplexer 31 according to the third preferred embodiment. The second band-pass filter 35 includes a longitudinally coupled resonator-type elastic wave filter 42 and elastic wave resonators 43 and 44. The elastic wave resonator 43 is connected between the longitudinally coupled resonator-type elastic wave filter 42 and the antenna terminal 33. The elastic wave resonator 44 is connected between a connection point between the elastic wave resonator 43 and the longitudinally coupled resonator-type elastic wave filter 42 and a ground potential.

In the second band-pass filter 35 including the longitudinally coupled resonator-type elastic wave filter 42, it is also desired that at least one of the elastic wave resonators 43 and 44 be defined by the elastic wave resonator 1. As a result, it is possible to reduce or prevent nonlinear distortions in the second band-pass filter 35. Like in the above-described case, only the elastic wave resonator 43 may be defined by the elastic wave resonator 1. Alternatively, only the elastic wave resonator 44 may be defined by the elastic wave resonator 1.

Figure 5:
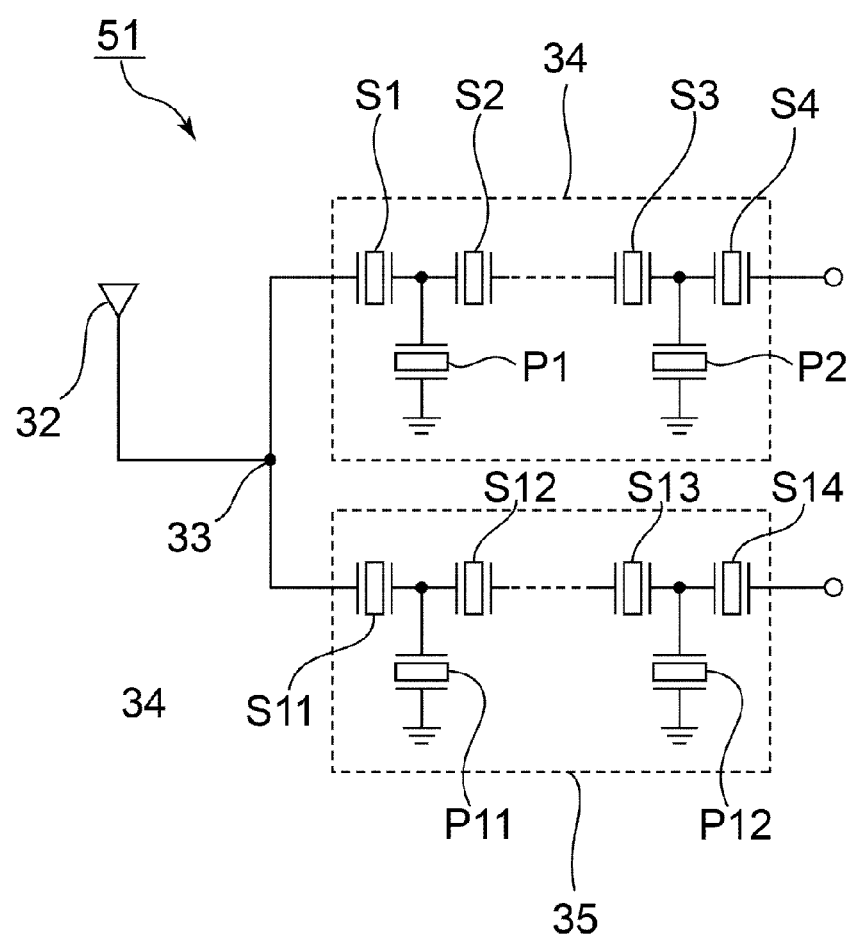
FIG. 5 is a circuit diagram of a duplexer according to a fifth preferred embodiment of the present invention.

In a duplexer 51 according to the fifth preferred embodiment of the present invention illustrated in FIG. 5, the first band-pass filter 34 is preferably the same as the first band-pass filter in the duplexer 31 according to the third preferred embodiment. The second band-pass filter 35 is a ladder filter including a plurality of series arm resonators S11 to S14 and a plurality of parallel arm resonators P11 and P12. Thus, the second band-pass filter 35 may be a ladder filter. In this case, the series arm resonator S11 to S14 and the parallel arm resonators P11 and P12 are elastic wave resonators. It is desired that at least one of these elastic wave resonators be defined by the elastic wave resonator 1 according to a preferred embodiment of the present invention.

More preferably, it is desired that at least one of the series arm resonator S11 and the parallel arm resonator P11 nearest to the antenna terminal 33, that is, a synthesis end, be defined by an elastic wave resonator according to a preferred embodiment of the present invention. As a result, it is possible to efficiently reduce or prevent second-order nonlinear distortions on the side of the second band-pass filter 35.

Figure 6:
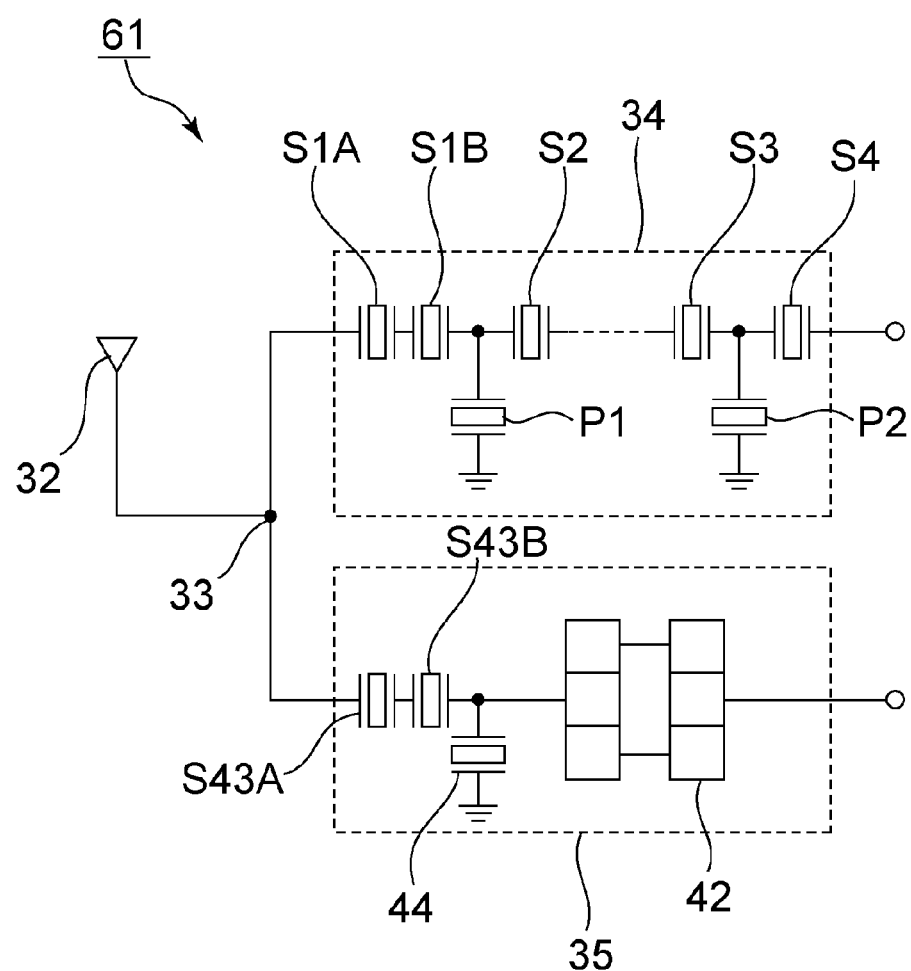
FIG. 6 is a circuit diagram of a duplexer according to a sixth preferred embodiment of the present invention.

FIG. 6 is a circuit diagram of a duplexer 61 according to the sixth preferred embodiment of the present invention. In the duplexer 61, the first band-pass filter 34 has a structure in which series arm resonators S1A and S1B are connected in series to each other on the side of the antenna terminal 33. The second band-pass filter 35 has also a structure in which elastic wave resonators S43A and S43B are connected in series to each other on the side of the antenna terminal 33.

Except that the above-described point, the first band-pass filter 34 is preferably the same as the first band-pass filter 34 in the duplexer 31 according to the third preferred embodiment. Except that the above-described point, the second band-pass filter 35 is the same as the second band-pass filter 35 in the duplexer 41 according to the fourth preferred embodiment. Thus, a series arm resonator nearest to a synthesis end may be divided into two. Like in the above-described cases, by using the elastic wave resonator 1 according to a preferred embodiment of the present invention as the parallel arm resonator P1 and the elastic wave resonator 44, it is possible to efficiently reduce or prevent second-order nonlinear distortions and achieve miniaturization.

Figure 7:
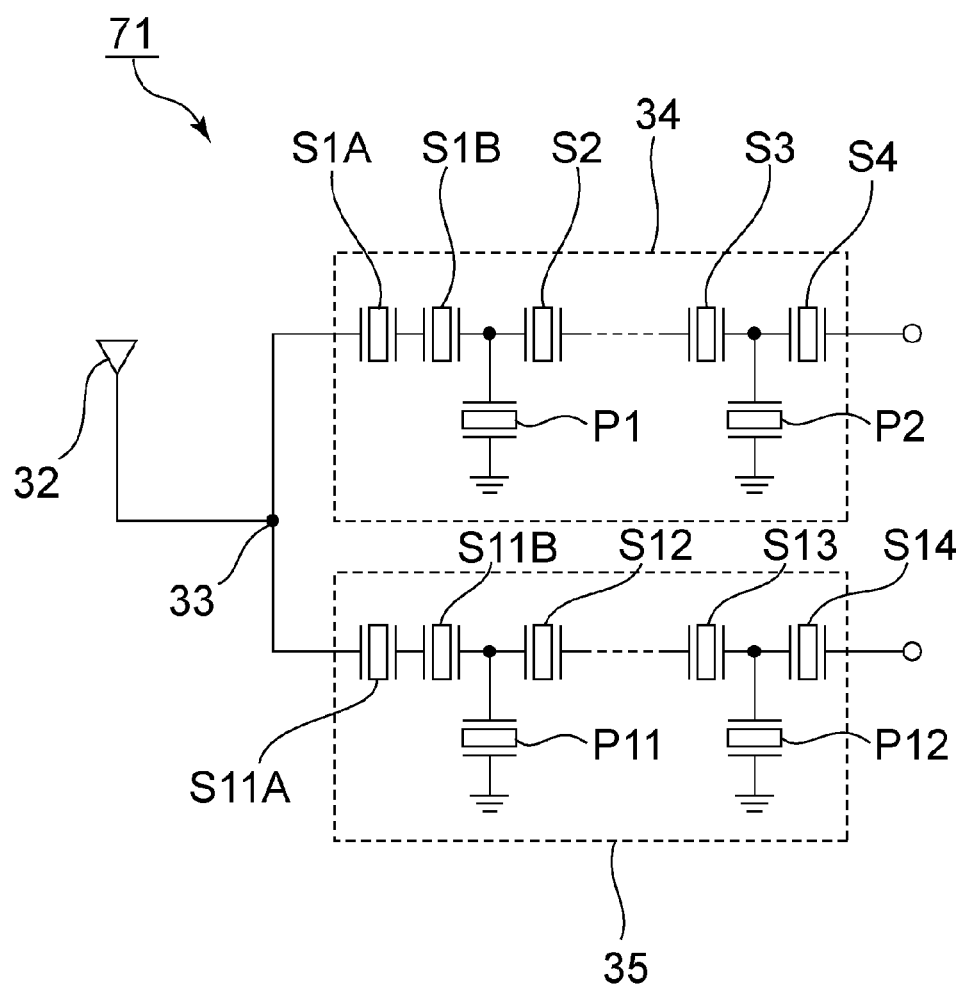
FIG. 7 is a circuit diagram of a duplexer according to a seventh preferred embodiment of the present invention.

FIG. 7 is a circuit diagram of a duplexer 71 according to the seventh preferred embodiment of the present invention. In the duplexer 71, the first band-pass filter 34 preferably is the same as the first band-pass filter 34 according to the sixth preferred embodiment. In the second band-pass filter 35, a series arm resonator nearest to the antenna terminal 33 is divided into series arm resonators S11A and S11B. Except for this point, the second band-pass filter 35 preferably is the same as the second band-pass filter 35 in the duplexer 51 according to the fifth preferred embodiment.

Like in the above-described preferred embodiments, in the seventh preferred embodiment, by using the elastic wave resonator 1 according to a preferred embodiment of the present invention as the parallel arm resonators P1 and P11, it is possible to efficiently reduce or prevent second-order nonlinear distortions and achieve miniaturization.

In the third to seventh preferred embodiments, duplexers each including the first band-pass filter 34 and the second band-pass filter 35 have been described. The present invention can also be applied to a band-pass filter apparatus such as the first band-pass filter 34 or the second band-pass filter 35. Accordingly, a filter apparatus having a ladder circuit configuration including a plurality of elastic wave resonators, for example, the first band-pass filter 34 according to the third preferred embodiment, corresponds to a filter apparatus according to the present invention. Various preferred embodiments of the present invention are applicable not only to a filter apparatus having a ladder circuit configuration but also to an elastic wave filter apparatus including a plurality of elastic wave resonators. Furthermore, various preferred embodiments of the present invention are applicable to a filter apparatus including an elastic wave resonator and another filter element, for example, the second band-pass filter 35 according to the fourth preferred embodiment including the longitudinally coupled resonator-type elastic wave filter 42.

Figure 9:
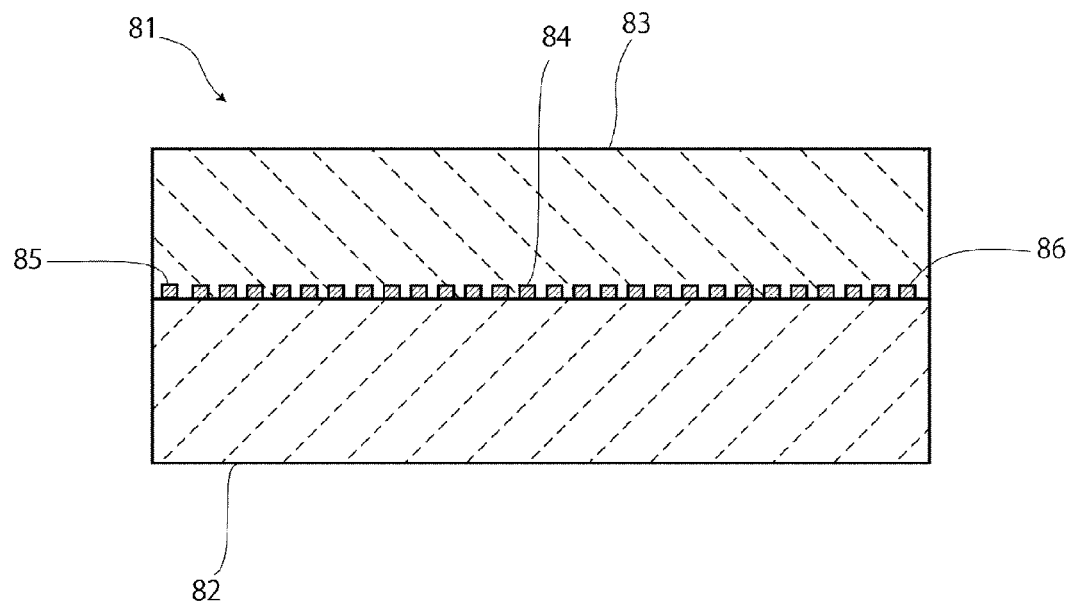
FIG. 9 is an elevational cross-sectional view illustrating an exemplary structure of a boundary acoustic wave apparatus.

Still furthermore, various preferred embodiments of the present invention are applicable not only to a surface acoustic wave resonator but also to a boundary acoustic wave resonator having a structure illustrated in FIG. 9. A boundary acoustic wave resonator 81 illustrated in FIG. 9 includes a piezoelectric substrate 82 and a second solid medium 83 different from the piezoelectric substrate 82. At an interface between the piezoelectric substrate 82 and the medium 83, an IDT electrode 84 and reflectors 85 and 86 are provided. By making an electrode structure including the IDT electrode 84 and the reflectors 85 and 86 conform to the electrode structure 3 of the elastic wave resonator 1 according to a preferred embodiment of the present invention, a one-port boundary acoustic wave resonator according to the present invention is provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
   a first terminal;
   a second terminal;
   a piezoelectric substrate;
   a first interdigital transducer electrode and a second interdigital transducer electrode located on the piezoelectric substrate;
   a first reflector disposed on a first side of a region where the first interdigital transducer electrode and the second interdigital transducer electrode are located; and
   a second reflector disposed on a second side of the region where the first interdigital transducer electrode and the second interdigital transducer electrode are located, the second side being located opposite from the first side in an elastic wave propagation direction; wherein
   the first reflector and the second reflector are shared by the first interdigital transducer electrode and the second interdigital transducer electrode;
   the first interdigital transducer electrode including a first bus bar and a shared bus bar disposed apart from the first bus bar;
   the second interdigital transducer electrode including the shared bus bar shared with the first interdigital transducer electrode and a second bus bar disposed apart from the shared bus bar;
   the first bus bar is disposed across the shared bus bar from the second bus bar;
   the shared bus bar is electrically connected to the first reflector and connected to the first terminal;
   the second reflector is electrically connected to the first bus bar and the second bus bar and is connected to the second terminal; and
   the first interdigital transducer electrode and the second interdigital transducer electrode are electrically connected in parallel between the first terminal and the second terminal.

2. The elastic wave resonator according to claim 1, wherein a voltage application direction between the first bus bar and the shared bus bar in the first interdigital transducer electrode is the same as a projected polarization direction obtained by projecting a polarization direction of the piezoelectric substrate on a surface of the piezoelectric substrate, and a voltage application direction between the shared bus bar and the second bus bar in the second interdigital transducer electrode is opposite to the projected polarization direction.

3. The elastic wave resonator according to claim 1, wherein each of the first reflector and the second reflector includes a plurality of electrode fingers, a first end bus bar that couples first end portions of the electrode fingers, a second end bus bar that couples the second end portions of the electrode fingers, and an intermediate bus bar that couples intermediate portions of the electrode fingers.

4. The elastic wave resonator according to claim 3, wherein the first bus bar and the first end bus bar in the second reflector extend in the same direction and are integrated, and the second bus bar and the second end bus bar in the second reflector extend in the same direction and are integrated.

5. The elastic wave resonator according to claim 3, wherein the shared bus bar and the intermediate bus bar in the first reflector extend in the same direction and are integrated.

6. The elastic wave resonator according to claim 1, wherein the elastic wave resonator is a one-port elastic wave resonator.

7. An elastic wave filter apparatus comprising a plurality of elastic wave resonators, wherein at least one of the plurality of elastic wave resonators is the elastic wave resonator according to claim 1.

8. The elastic wave filter apparatus according to claim 7, wherein the plurality of elastic wave resonators define a ladder circuit.

9. The elastic wave filter apparatus according to claim 8, wherein
the ladder circuit includes a plurality of series arm resonators and a plurality of parallel arm resonators;
the plurality of series arm resonators and the plurality of parallel arm resonators are defined by the plurality of elastic wave resonators; and
at least one of plurality of the series arm resonators and the plurality of parallel arm resonators is defined by the at least one of the plurality of elastic wave resonators.

10. The elastic wave filter apparatus according to claim 7, wherein a voltage application direction between the first bus bar and the shared bus bar in the first interdigital transducer electrode is the same as a projected polarization direction obtained by projecting a polarization direction of the piezoelectric substrate on a surface of the piezoelectric substrate, and a voltage application direction between the shared bus bar and the second bus bar in the second interdigital transducer electrode is opposite to the projected polarization direction.

11. The elastic wave filter apparatus according to claim 7, wherein each of the first reflector and the second reflector includes a plurality of electrode fingers, a first end bus bar that couples first end portions of the electrode fingers, a second end bus bar that couples the second end portions of the electrode fingers, and an intermediate bus bar that couples intermediate portions of the electrode fingers.

12. The elastic wave filter apparatus according to claim 11, wherein the first bus bar and the first end bus bar in the second reflector extend in the same direction and are integrated, and the second bus bar and the second end bus bar in the second reflector extend in the same direction and are integrated.

13. The elastic wave filter apparatus according to claim 11, wherein the shared bus bar and the intermediate bus bar in the first reflector extend in the same direction and are integrated.

14. A duplexer comprising:
a first band-pass filter connected to an antenna terminal; and
a second band-pass filter that is connected to the antenna terminal and has a pass band different from that of the first band-pass filter; wherein
at least one of the first band-pass filter and the second band-pass filter includes the elastic wave resonator according to claim 1.

15. The duplexer according to claim 14, wherein
at least one of the first band-pass filter and the second band-pass filter includes a plurality of elastic wave resonators; and
at least one of the plurality of elastic wave resonators on a side nearest to the antenna terminal is the elastic wave resonator.

16. The duplexer according to claim 14, wherein a voltage application direction between the first bus bar and the shared bus bar in the first interdigital transducer electrode is the same as a projected polarization direction obtained by projecting a polarization direction of the piezoelectric substrate on a surface of the piezoelectric substrate, and a voltage application direction between the shared bus bar and the second bus bar in the second interdigital transducer electrode is opposite to the projected polarization direction.

17. The duplexer according to claim 14, wherein each of the first reflector and the second reflector includes a plurality of electrode fingers, a first end bus bar that couples first end portions of the electrode fingers, a second end bus bar that couples the second end portions of the electrode fingers, and an intermediate bus bar that couples intermediate portions of the electrode fingers.

18. The duplexer according to claim 17, wherein the first bus bar and the first end bus bar in the second reflector extend in the same direction and are integrated, and the second bus bar and the second end bus bar in the second reflector extend in the same direction and are integrated.

19. The duplexer according to claim 17, wherein the shared bus bar and the intermediate bus bar in the first reflector extend in the same direction and are integrated.

* * * * *